United States Patent
Andoh (10) Patent No.: US 7,511,316 B2
(45) Date of Patent: Mar. 31, 2009

(54) SEMICONDUCTOR DEVICE RESISTIVE TO HIGH VOLTAGE AND CAPABLE OF CONTROLLING LEAKAGE CURRENT

(75) Inventor: Hideyuki Andoh, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 366 days.

(21) Appl. No.: 11/091,961

(22) Filed: Mar. 29, 2005

(65) Prior Publication Data

US 2005/0218425 A1     Oct. 6, 2005

(30) Foreign Application Priority Data

Mar. 30, 2004   (JP) ............................ P2004-098792
Sep. 16, 2004   (JP) ............................ P2004-270118

(51) Int. Cl.
   *H01L 29/74* (2006.01)
(52) U.S. Cl. ...................................... 257/110; 257/119
(58) Field of Classification Search ................ 257/110, 257/119; 323/240, 325
See application file for complete search history.

(56) References Cited

U.S. PATENT DOCUMENTS 4,316,205 A * 2/1982 Aoki et al. .................. 257/292
4,999,683 A * 3/1991 Kiyomura et al. ........... 257/606
5,468,673 A * 11/1995 Le Roux et al. ............. 438/328
5,541,140 A    7/1996 Goebel et al.
5,766,973 A    6/1998 Goebel et al.

FOREIGN PATENT DOCUMENTS

| JP | 55125671    | 9/1980  |
| JP | 1273361     | 11/1989 |
| JP | 20011257211 | 9/2001  |
| JP | 2003243672  | 8/2003  |
| JP | 2004022878  | 1/2004  |

* cited by examiner

*Primary Examiner*—Jerome Jackson, Jr.
*Assistant Examiner*—Jami M Valentine
(74) *Attorney, Agent, or Firm*—Bachman & LaPointe, P.C.

(57) ABSTRACT

A semiconductor device is provided which comprises a periphery region 23a extending downward from a third semiconducting region 23, enveloping an outer surfaces 21a and 22b of first and second semiconducting regions 21 and 22. A PN junctions is formed between second and third semiconducting regions 22, 23 inside of periphery region 23a perfectly away from side surfaces 28 of semiconductor substrate 27 to exert no adverse effect on breakdown by crystal defect in and foreign matters attached to side surfaces of semiconductor substrate 27. As periphery region 23a has the thinner diffusion concentration of impurity with the deeper area of periphery region 23a to widely spread depletion layer on boundary of the periphery region 23a with increase electric resistance.

4 Claims, 6 Drawing Sheets

SEMICONDUCTOR DEVICE RESISTIVE TO HIGH VOLTAGE AND CAPABLE OF CONTROLLING LEAKAGE CURRENT

TECHNICAL FIELD

This invention relates to a semiconductor device such as a diode device resistive to high voltage and a method of manufacture therefor.

BACKGROUND OF THE INVENTION

Diodes of planar structure type are known which have a higher diffusion concentration of impurity in the central area than that in the periphery area in which a PN junction is formed to generate a breakdown in the central area. Such diodes of PN junction have been expected to indicate the improved reliability in quality compared with diodes of mesa structure which have a slope formed on side surfaces of the semiconductor substrate to expose outward the PN junction on the slope.

Figure 11:
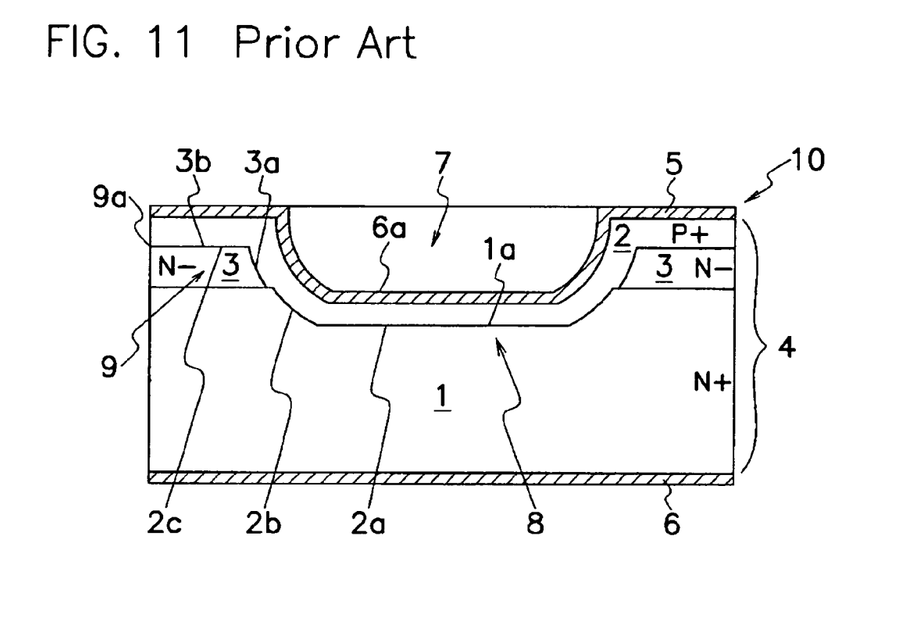
FIG. 11 is a sectional view of a prior art diode device.

FIG. 11 shows a structure of a diode device shown by International Patent Publication WO 03/081681. Shown diode device 10 comprises a first semiconducting region 1 of N+conductivity type; a second semiconducting region 2 of P+conductivity type formed over one main surface of first semiconducting region 1; and a third semiconducting region 3 of N−conductivity type formed between first and second semiconducting regions 1 and 2 and having the thinner diffusion concentration than those of first and second semiconducting regions 1 and 2. Second semiconducting region 2 comprises a bowl portion 2a which has a flat bottom surface 2d directly joined on first semiconducting region 1 and partially spherical surface 2b, and a flat flange portion 2c enveloping bowl portion 2a and positioned over first semiconducting region 1 through third semiconducting region 3. A first electrode 5 is formed on a whole main (upper) surface of second semiconducting region 2, and a second electrode 6 is formed on the other (bottom) surface of first semiconducting region 1. A recess 7 is formed at the center of an upper surface of diode device 10, and an inner junction region 8 is formed in direct PN junctions between a bowl surface 1a of first semiconducting region 1 and flat bottom surface 2d of second semiconducting region 2 and between bowl surface 1a of first semiconducting region 1 and spherical surface 2b of second semiconducting region 2. In other words, inner junction region 8 forms a flat or bowl-shaped direct PN junction interface between first and second semiconducting regions 1 and 2 which both have the higher diffusion concentration of impurity than that of third semiconducting region 3 to provide a desirable endurance against high voltage or breakdown as estimated based on first and second semiconducting regions 1 and 2. Not shown, but third semiconducting region 3 is formed into an annular shape in an imaginary plan view, enveloping inner junction region 8 and being in direct contact to second semiconducting region 2 to form an outer junction region 9 in cooperation with second semiconducting region 2. Third semiconducting region 3 comprises a tapered surface 3a convergent toward bowl surface 1a of first semiconducting region 1, and a flat surface 3b enveloping tapered surface 3a to form PN junctions between second semiconducting region 2 and tapered surface 3a and between second semiconducting region 2 and flat surface 3b. Outer junction region 9 has outer surfaces 9a exposed outward on side surfaces of a semiconductor substrate 4. In operation of diode device 10, outer junction region 9 serves to allow a depletion layer (not shown) to widely spread from outer junction region 9 between second and third semiconducting regions 2 and 3, in particular, extensively expanding into third semiconducting region 3 of thin diffusion concentration of impurity.

Figure 12:
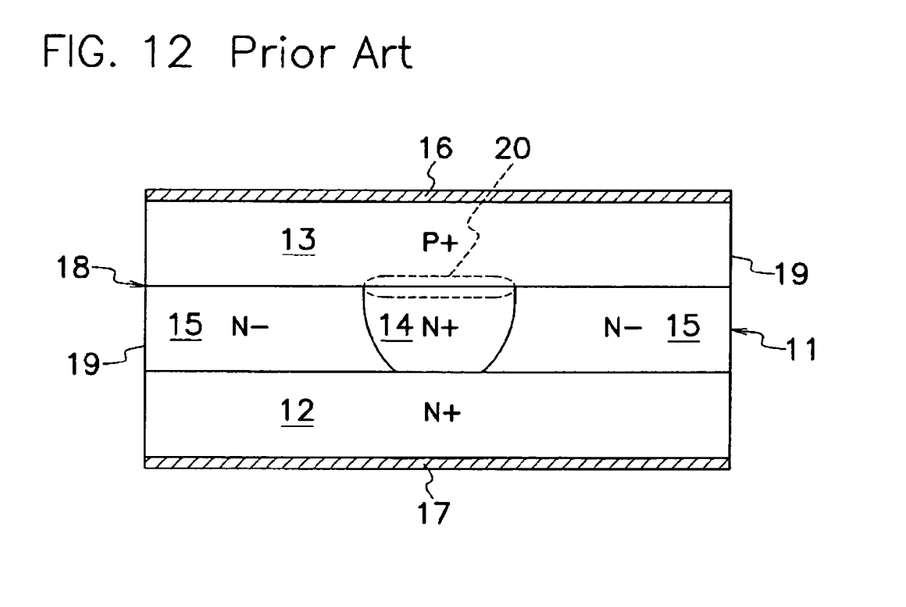
FIG. 12 is a sectional view of another prior art diode device.

In another aspect, Japanese Patent Disclosure No. 2002-185016 represents a diode device provided with a silicon substrate 11 which, as shown in FIG. 12, comprises a first semiconducting region 12 of N+conductivity type formed at the bottom of silicon substrate 11; a second semiconducting region 13 of P+conductivity type formed over first semiconducting region 12; a third semiconducting region 15 of N−conductivity type formed between first and second semiconducting region 12 and 13; and a fourth semiconducting region 14 of N+conductivity type formed inside of third semiconducting region 15 and between first and second semiconducting regions 12 and 13. Fourth semiconducting region 14 has the higher diffusion concentration than that of surrounding third semiconducting region 15. A first electrode 16 is formed on an upper surface of second semiconducting region 13, and a second electrode 17 is formed on a bottom surface of first semiconducting region 12.

Diode device 10 shown in FIG. 11 is defective because recess 7 provides diode device 10 with a complicated sectional structure, and makes it difficult to form first electrode 5 into a desirable shape when recess 7 is formed at the center on upper surface of semiconductor substrate 4. Also, another problem arises that mechanical stresses disadvantageously concentrate on recess 7, and may invite crystal defects in semiconductor substrate 4, thereby resulting in deterioration in electric property. In addition, as diode device 10 requires a specific processing for silicon etching in manufacture to form recess 7 on upper surface of semiconductor substrate 4, such processing is troublesome, and cannot provide a more stable shape of semiconductor substrate 4 than that of a typical planar structure.

In diode device shown in FIG. 12, as the same diffusion concentration of impurity is given along PN junction interface 18 from outermost points of breakdown area 20 at the center of PN junction interface 18 to outer peripheral surfaces 19 of silicon substrate 11, breakdown may be propagated to outer peripheral surfaces 19. In mechanically dicing silicon substrate 11 by means of diamond blades to cut and separate it into many semiconductor chips, dicing operation tends to produce cracks or breaks on outer peripheral surfaces 19. Also, foreign matters such as dust, dirt or cut scraps including ions tend to attach to outer peripheral surfaces 19 without protective film thereon. Accordingly, propagation of breakdown to outer peripheral surfaces 19, moves or changes the breakdown voltage, and therefore, diode device 10 cannot indicate a high and stable voltage endurance. In addition, there is a risk that excessive reverse current flows along outer peripheral surfaces 19 of silicon substrate 11 to damage or burn silicon substrate 11 with reverse current.

An object of the present invention is to provide a semiconductor device capable of controlling leakage current and having a stable voltage endurance, and a method of easy manufacture therefor.

SUMMARY OF THE INVENTION

The semiconductor device according to the present invention includes a semiconductor substrate (27) which comprises: a first semiconducting region (21); a second semiconducting region (22) formed on one side of the first semiconducting region (21); a third semiconducting region (23) of the conductivity type different from that of the first and second semiconducting regions (21, 22); and a fourth semiconducting region (24) formed on the other side of the first semiconducting region (21). The second semiconducting region (22) has the higher diffusion concentration of impurity than that of the first semiconducting region (21). The third semiconducting region (23) is formed adjacent to the second semiconducting region (22) on the opposite side of the first semiconducting region (21) to form a PN junction region between the second and third semiconducting regions (22, 23). The fourth semiconducting region (24) has the higher diffusion concentration of impurity than that of the first semiconducting region (21). The third semiconducting region (23) has a periphery region (23a) for environing outer surfaces (21a, 22b) of the first and second semiconducting regions (21, 22). The periphery region (23a) is formed to taper or converge downward without reaching the fourth semiconducting region (24) and having the thinner diffusion concentration of impurity with the deeper area to generate breakdown on the central side of the semiconductor substrate (27).

BRIEF DESCRIPTION OF THE DRAWINGS

The above-mentioned and other objects and advantages of the present invention will be apparent from the following description in connection with preferred embodiment shown in the accompanying drawings wherein.

BEST MODE FOR CARRYING OUT THE INVENTION

Figure 1:
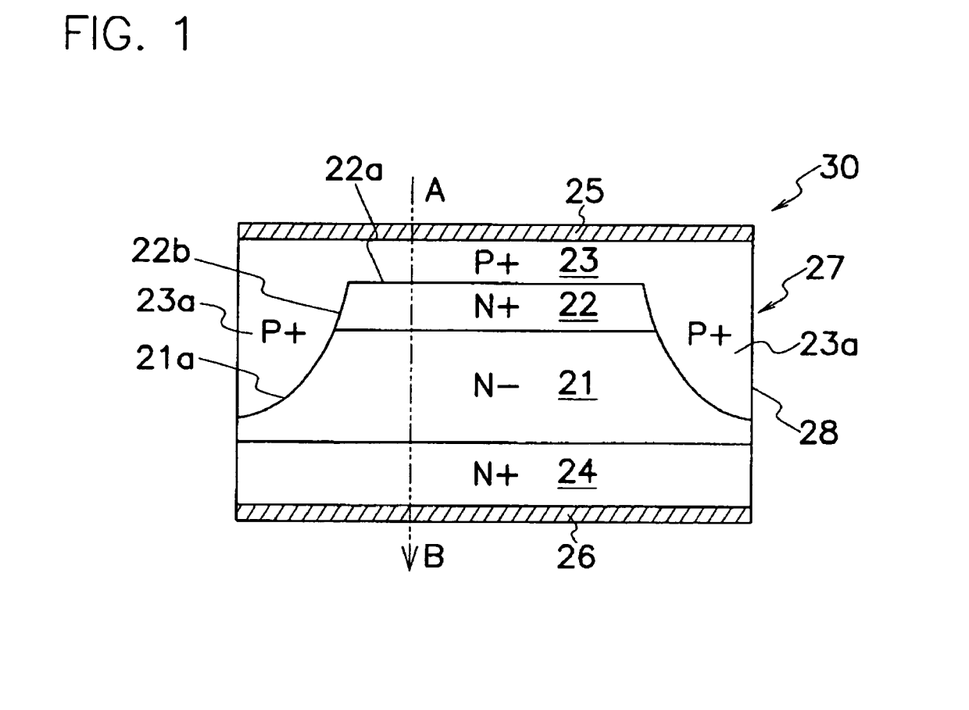
FIG. 1 is a sectional view of an embodiment according to the present invention applied to a semiconductor diode device.

Embodiments of the present invention applied to diode devices and manufacture therefor are described hereinafter with reference to FIGS. 1 to 10 of the accompanying drawings:

As shown in FIG. 1, a diode chip or device 30 according to the present invention comprises a first semiconducting region 21 of N−conductivity type; a second semiconducting region 22 of N+conductivity type formed on an upper side of first semiconducting region 21; a third semiconducting region 23 of P+conductivity type formed adjacent to second semiconducting region 22 on the opposite side of first semiconducting region 21; a fourth semiconducting region 24 of N+conductivity type formed on bottom side of first semiconducting region 21; a first electrode 25 formed on and in electric connection to third semiconducting region 23; and a second electrode 26 formed on and in electric connection to fourth semiconducting region 24. First to fourth semiconducting regions 21 to 24 form a semiconductor substrate 27, first semiconducting region 21 forms a cathode region for diode device 30 in cooperation with second and fourth semiconducting regions 22 and 24, and third semiconducting region 23 forms an anode region for diode device 30. PN junction regions are formed between second and third semiconducting regions 22 and 23.

Second and fourth semiconducting regions 22, 24 have their higher diffusion concentration of impurity than that of first semiconducting region 21, and second and third semiconducting regions 22 and 23 cooperate together to form an inner PN junction region between an upper surface 22a of second semiconducting region 22 and third semiconducting region 23. Third semiconducting region 23 has a periphery region 23a of P+ conductivity type formed to extend and taper or converge downward, enveloping an outer surface 22b of second semiconducting region 22 and an outer surface 21a of first semiconducting region 21, but without reaching fourth semiconducting region 24. Accordingly, electric resistance in periphery region 23a increases with the deeper area to more easily spread associated depletion layers and more strongly prevent current or leakage current from passing through the deeper area. Fourth semiconducting region 24 is formed on the other side of first semiconducting region 21 with the higher diffusion concentration of impurity in fourth semiconducting region 24 than that of first semiconducting region 21, and periphery region 23a does not reach fourth semiconducting region 24. Therefore, a wide depletion layer can be formed in first semiconducting region 21 to prevent breakdown area from spreading toward side surfaces 28 of semiconductor substrate 27.

Figure 2:
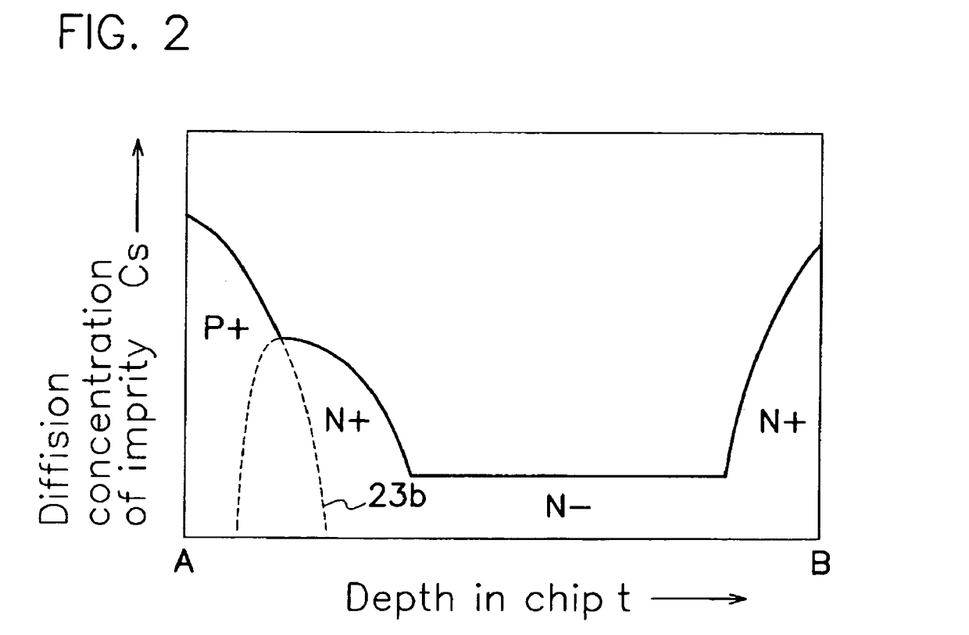
FIG. 2 is a graph showing the variation in diffusion concentration of impurity with depth in chip taken along a line A-B shown in FIG. 1.

It should be noted that third semiconducting region 23 has the thinner diffusion concentration of impurity with the deeper area or downward from upper surface of semiconductor substrate 27, and therefore, impurity concentration in periphery region 23a is thinner than that of third semiconducting region 23 in contact to second semiconducting region 22, and also, as shown by a symbol 23b in FIG. 2, the deeper area of periphery region 23a has the thinner diffusion concentration of impurity. In other words, diffusion concentration in periphery region 23a around first semiconducting region 21 is thinner or leaner than that around second semiconducting region 22. Accordingly, an inner PN junction is formed on central side of semiconductor substrate 27 by contact between P and N type semiconducting regions of relatively high impurity concentration, and an outer PN junction is formed on periphery side of semiconductor substrate 27 by contact between P and N type semiconducting regions of relatively low impurity concentration. Specifically, first semiconducting region 21 forms an outer PN junction along a boundary outer surface 21a with periphery region 23a, and second semiconducting region 22 forms an intermediate PN junction on a boundary outer surface 22b with third semiconducting region 23. Impurity concentration in first semiconducting region 21 is thinner than that in second semiconducting region 22. In other words, inner PN junction is formed on central side of semiconductor substrate 27 between an upper surface 22a of second semiconducting region 22 and third semiconducting region 23 with their relatively high impurity concentration. Outer PN junction is formed on periphery side of semiconductor substrate 27 between first semiconducting region 21 and periphery region 23a with their relatively low impurity concentration. Accordingly, when adverse voltage is applied across outer, intermediate and inner PN junctions, outer PN junction produces wider depletion layer than that produced by inner PN junction to generate breakdown on central side of semiconductor substrate 27. Also, as inner PN junction is defined inside of periphery region 23a perfectly away from side surfaces 28 of semiconductor substrate 27, no adverse effect is exerted on breakdown by crystal defect in and foreign matters attached to side surfaces 28 of semiconductor substrate 27. In addition, as the deeper area of periphery region 23a has the thinner diffusion concentration of impurity to widely spread depletion layer on boundary of periphery region 23a with increase in electric resistance, when adverse voltage is applied across outer and inner PN junctions, reverse electric current hardly flows through peripheral areas of outer PN junction, but flows through inner PN junction without outward deviation or deflection of reverse current path to control fluctuation in voltage endurance and reverse leakage overcurrent. This ensures that semiconductor substrate 27 certainly brings about breakdown on central side and prevents fluctuation in endurance voltage and occurrence of reverse leakage overcurrent flowing through side surfaces 28 of semiconductor substrate 27. In addition, relatively large PN junction interface formed on boundary between second and third semiconducting regions 22 and 23, establishes relatively large current capacity. Furthermore, diode device 30 can be formed into a planar structure without concentration of mechanical stress to prevent deterioration in electric property by crystal defect.

Figure 3:
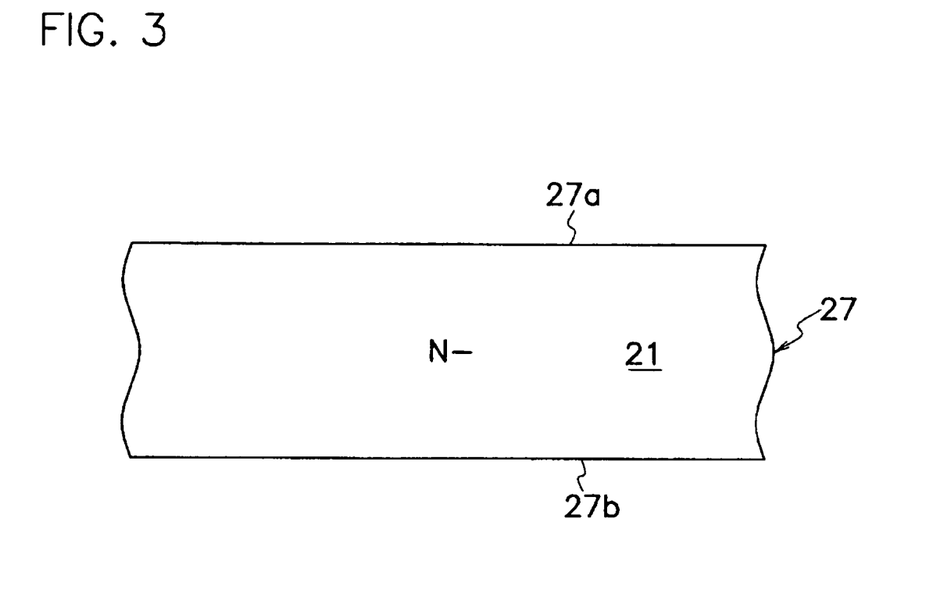
FIG. 3 is a sectional view of an original semiconductor substrate.
Figure 4:
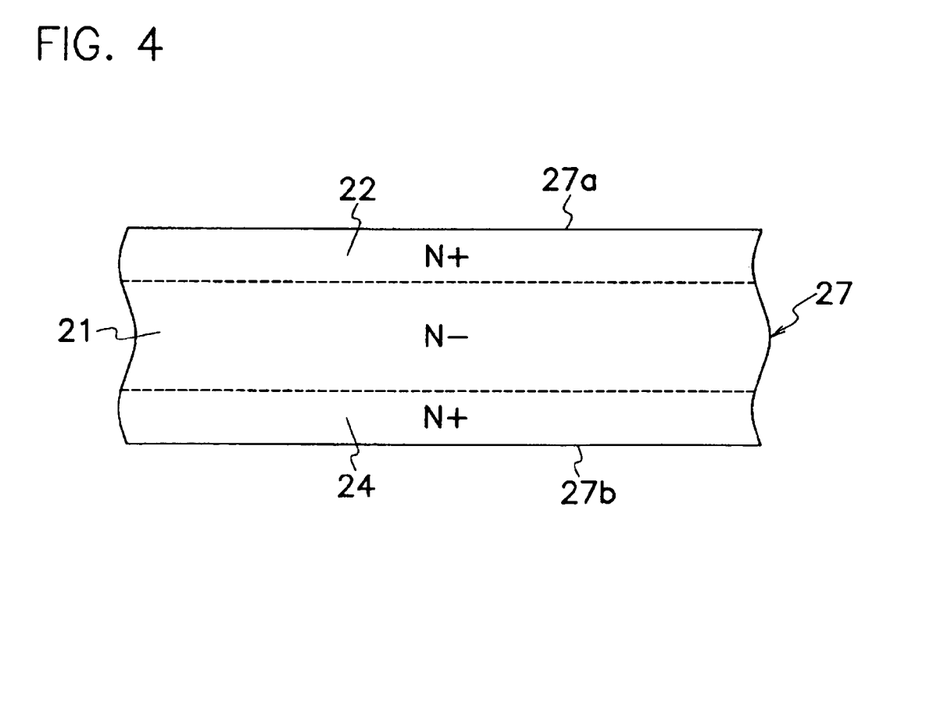
FIG. 4 is a sectional view of the semiconductor substrate after doping a first impurity.
Figure 5:
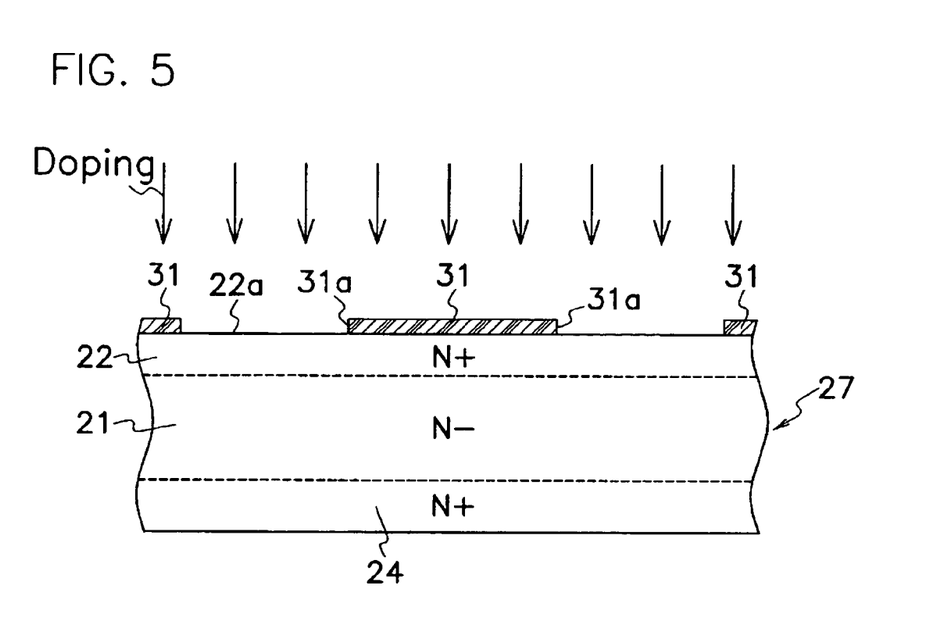
FIG. 5 is a sectional view of the semiconductor substrate upon further doping a second impurity.
Figure 6:
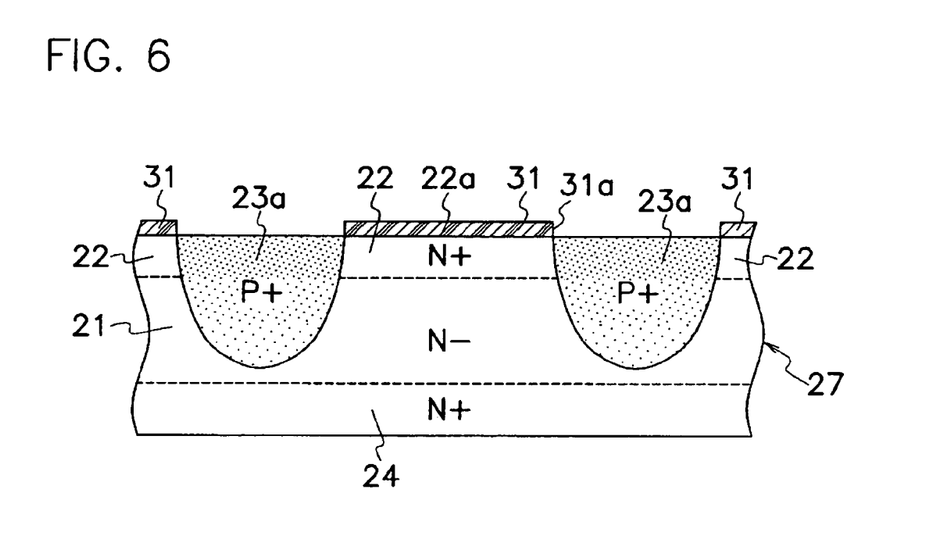
FIG. 6 is a sectional view of the semiconductor substrate formed with a periphery region.

In manufacturing diode device 30, a semiconductor chip or substrate 27 shown in FIG. 3 is prepared which forms a first semiconducting region 21 of N–conductivity type. Initially, a first impurity is doped into chip 27 from first and second main surfaces 27a and 27b to form second and fourth semiconducting regions 22 and 24 of N+conductivity type on opposite sides of first semiconducting region 21 as shown in FIG. 4. Both of second and fourth semiconducting regions 22 and 24 have their higher diffusion concentration than that of first semiconducting region 21. In this case, in lieu of simultaneous formation of second and fourth semiconducting regions 22 and 24, one of them may firstly be formed by doping, and then the other may secondly be formed. Then, as shown in FIG. 5, a main surface 22a of second semiconducting region 22 is coated with a resist film 31 formed with a plurality of openings 31a, and a second impurity is doped from openings 31a into exposed areas of second semiconducting region 22 to easily form periphery region 23a of P+conductivity type enveloping first and second semiconducting regions 21 and 22 as shown in FIG. 6. Periphery region 23a has the conductivity type different from those of first and second semiconducting regions 21 and 22, but periphery regions 23a have the decreasing diffusion concentration of impurity in depth.

Figure 7:
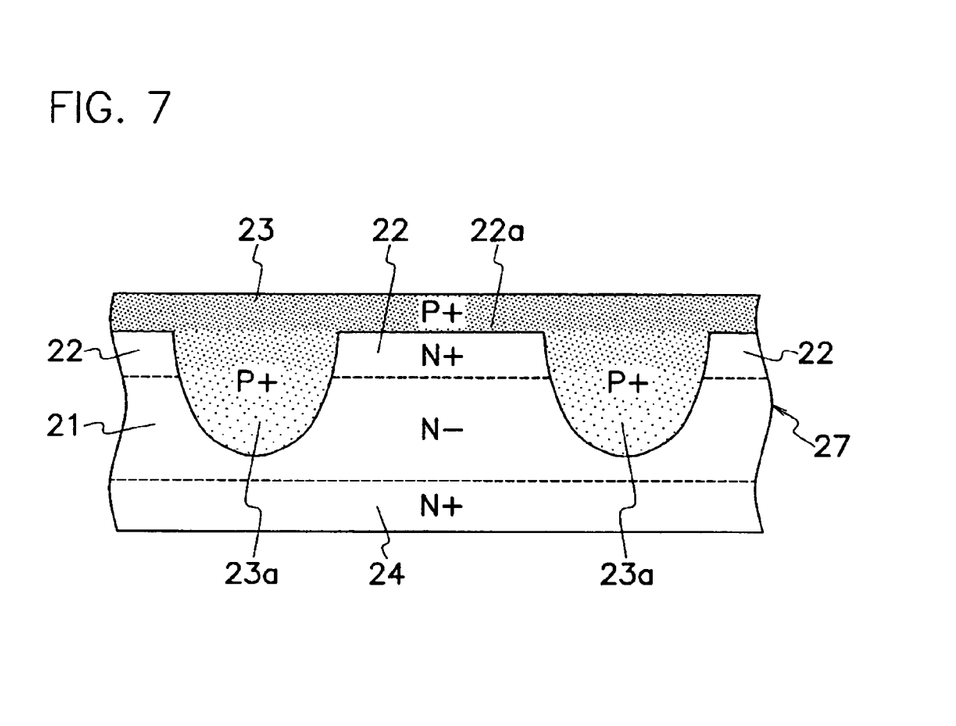
FIG. 7 is a sectional view of the semiconductor substrate formed with a third semiconducting region.

Subsequently, as shown in FIG. 7, resist film 31 is removed from second semiconducting region 22, and second impurity is again doped through a whole surface of and into second semiconducting region 22 to form a third semiconducting region 23 on a main surface 22a of second semiconducting region 22. Then, a first electrode 25 is formed on an upper surface of third semiconducting region 23, and a second electrode 26 is formed on a bottom surface of fourth semiconducting region 24. Finally, semiconductor substrate 27 is diced or cut along planes D shown in FIG. 8 perpendicularly to main surface 22a of second semiconducting region 22 through substantially each center of periphery regions 23a. In this way, second impurity is easily doped throughout exposed area of second semiconducting region 22 without resist film 31 to form third semiconducting region 23.

The foregoing embodiment can be modified in various ways. For example, in place of first, second and fourth semiconducting regions 21, 22 and 24 of N conductivity type and third semiconducting region 23 of P conductivity type, diode device 30 can utilize first, second and fourth semiconducting regions 21, 22 and 24 of P conductivity type, and third semiconducting region 23 of N conductivity type. Also, FIG. 7 illustrates doping of second impurity throughout main surface of third semiconducting region 23, alternatively surfaces over periphery regions 23a can partially be coated with another resist film with openings through which a sufficient amount of second impurity can be doped and diffused into undoped area of second semiconducting region 22 to form third semiconducting region 23 as an uppermost layer.

Figure 9:
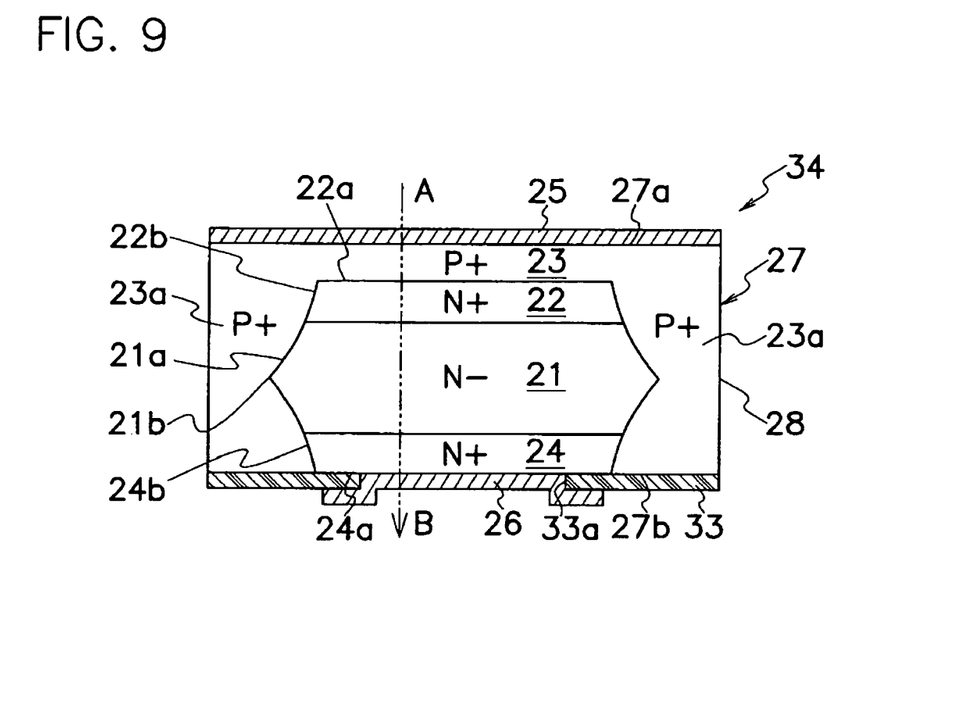
FIG. 9 is a sectional view of another embodiment according to the present invention applied to a semiconductor diode device.

FIG. 9 illustrates another embodiment of a diode device according to the present invention. Like diode device 30 shown in FIG. 1, a diode device 34 shown in FIG. 9 comprises a semiconductor substrate 27, and first and second electrodes 25 and 26 formed on upper and bottom surfaces 27a and 27b of semiconductor substrate 27. Substrate 27 comprises a first semiconducting region 21; a second semiconducting region 22 formed on an upper side of first semiconducting region 21; a third semiconducting region 23 formed adjacent to second semiconducting region 22 on the opposite side of first semiconducting region 21; and a fourth semiconducting region 24 formed on bottom side of first semiconducting region 21. Second and fourth semiconducting regions 22, 24 have their higher diffusion concentration of impurity than that of first semiconducting region 21, and second and third semiconducting regions 22 and 23 cooperate together to form an inner PN junction region between an upper surface 22a of second semiconducting region 22 and third semiconducting region 23. Third semiconducting region 23 has a periphery region 23a formed to environ an outer surface 22b of second semiconducting region 22, an outer surface 21a of first semiconducting region 21 and an outer surface 24b of fourth semiconducting region 24 so that outer surfaces 22b, 21a and 24b are not exposed outward from side surfaces 28 of semiconductor substrate 27. Outer surface 21a of first semiconducting region 21 has an annular protrusion 21b, and outer surface 21a of first semiconducting region 21 and outer surface 22b of second semiconducting region 22 are inclined to upwardly taper from annular protrusion 21b as the base so as to form a frustum or truncated petrosa such as truncated cone or pyramid. On the contrary, outer surface 21a of first semiconducting region 21 and outer surface 24b of fourth semiconducting region 24 are inclined to downwardly taper from annular protrusion 21b as the base so as to form an inverted frustum or inverted truncated petrosa such as inverted truncated cone or pyramid. Third semiconducting region 23 extends and flares upwardly and downwardly from annular protrusion 21b gradually expanding the sectional area with increased impurity concentration.

While diode device 30 shown in FIG. 1 has outer surface 21a of first semiconducting region 21 which is exposed outward on side surfaces 28 of semiconductor substrate 27, diode device 34 shown in FIG. 9 has peripheral region 23a of P type semiconductor region for environing outer surfaces 21a, 22b and 24b to form side surfaces 28 of semiconductor substrate 27. This ensures that peripheral region 23a certainly prevents excessive reverse current from flowing through side surfaces 28 of semiconductor substrate 27.

Figure 10:
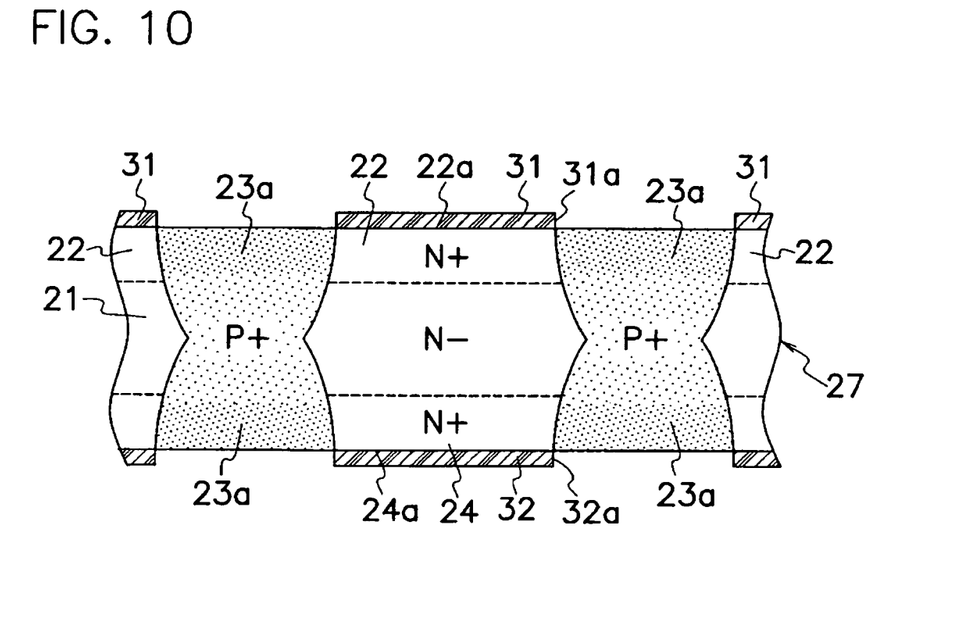
FIG. 10 is a sectional view showing a process for manufacture of the semiconductor diode device shown in FIG. 9.

In manufacturing diode device 34 shown in FIG. 9, similarly to manufacture of diode device 30 shown in FIG. 1, a first impurity is doped into chip 27 of first semiconducting region 21 from first and second main surfaces 27a and 27b to form second and fourth semiconducting regions 22 and 24 on opposite sides of first semiconducting region 21 as shown in FIG. 4. Both of second and fourth semiconducting regions 22 and 24 have their higher diffusion concentration than that of first semiconducting region 21. Then, as shown in FIG. 10, main surfaces 22a and 24a of second and fourth semiconducting regions 22 and 24 are coated with resist films 31 and 32 formed with a plurality of openings 31a and 32a, and a second impurity is doped from openings 31a and 32a into exposed areas of second and fourth semiconducting regions 22 and 24 to easily form periphery region 23a enveloping first, second and fourth semiconducting regions 21, 22 and 24. Periphery region 23a has the conductivity type different from those of first, second and fourth semiconducting regions 21, 22 and 24, but periphery regions 23a have the decreasing diffusion concentration of impurity in depth. Subsequently, after resist films 31 and 32 are removed from second and fourth semiconducting regions 22 and 24, second impurity is again doped through a whole surface of and into second semiconducting region 22 to form a third semiconducting region 23 on a main surface 22a of second semiconducting region 22. Then, after the other main surface 27b is coated with an insulating layer 33 to form openings 33a in insulating layer 33, a first electrode 25 is formed on an upper surface of third semiconducting region 23, and a second electrode 26 is formed in openings 33a and over a part of insulating layer 33 in electric contact of second electrode 26 to a bottom surface of fourth semiconducting region 24.

Figure 8:
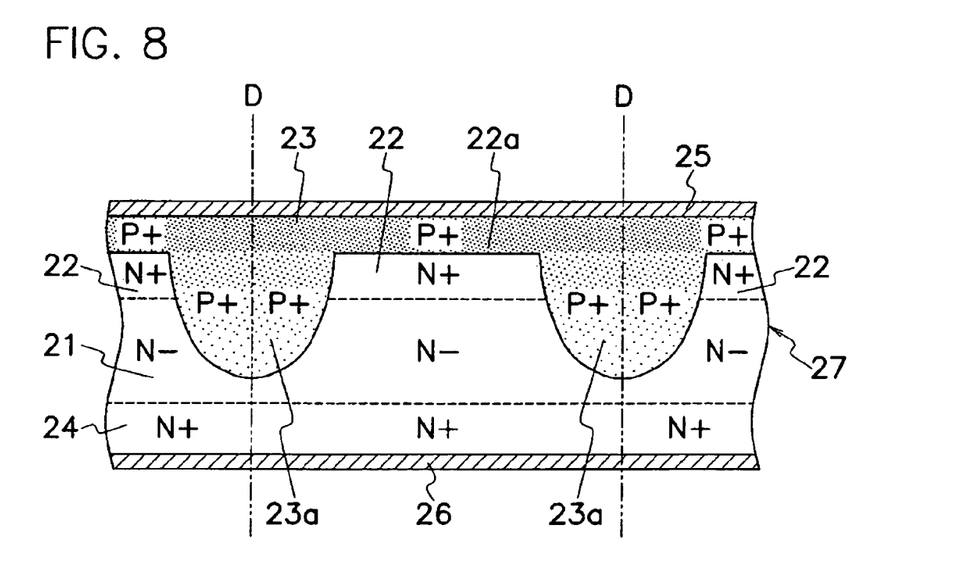
FIG. 8 is a sectional view of the semiconductor substrate formed with electrodes.

Finally, similarly to the process shown in FIG. 8, semiconductor substrate 27 is diced or cut along planes D perpendicularly to main surface 22a of second semiconducting region 22 through substantially each center of periphery regions 23a. As PN junctions between first and third semiconducting regions 21 and 23 are not exposed outward on diced side surfaces 28 of semiconductor substrate 27, reverse leakage current is not increased to more stably improve voltage endurance than that of first diode device 30 shown in FIG. 1 although side surfaces 28 involves crystal defect or attachment of foreign matter thereon.

As understood from FIG. 9, first and second electrodes 25 and 26 have their different appearance to easily distinguish P type anode and N type cathode electrodes of diode device 34. However, it should be noted that the above-mentioned processes for manufacture of diode devices 30 and 34 do not limit the present invention. In doping second impurity into second and fourth semiconducting regions 22 and 24 to form periphery region 23a of third semiconducting region 23, it would be optional which doping into second or fourth semiconducting regions 22 or 24 should have a priority or be done simultaneously. Similar modifications to diode device 30 shown in FIG. 1 would be able to also be applied to diode device 34 shown in FIG. 9.

As understood from the foregoing, as second and third regions 22 and 23 cooperate to form between them an inner PN junction region perfectly away from side surfaces 28 of semiconductor substrate 27, no adverse effect is exerted on breakdown although side surfaces 28 of semiconductor substrate 27 are subject to production of crystal defect or attachment of foreign matters. Reduction in diffusion concentration of impurity with depth in periphery region 23a promotes spreading of depletion layers on boundary of periphery region 23a with increased electric resistance. Accordingly, when adverse voltage is applied on outer, intermediate and inner PN junctions, depletion layer spreads from outer PN junction wider than that spread from inner PN junction to generate breakdown on central side of semiconductor substrate 27, and reverse electric current hardly flows through peripheral areas of outer PN junction, but flows through inner PN junction without outward deviation or deflection of reverse current path in periphery region 23a. As a result, as breakdown stably occurs on central side of semiconductor substrate 27, voltage endurance does not fluctuate, while controlling reverse leakage overcurrent. In addition, tapered shape of periphery region 23a serves to expand a sectional area of electric path through PN junctions formed on interface between second and third semiconducting regions 22, 23 for establishment of relatively large current capacity. A bottom electrode 26 can be formed on a bottom surface of fourth semiconducting region 24 with electric contact of low resistance to reduce operation voltage of the semiconductor device.

Accordingly, the present invention is very effective to easily manufacture a semiconductor device of planar structure which has the stable and high voltage endurance and reliable quality without any special processing such as silicon etching by controlling leakage current resulted from affix or deposit on side surfaces of semiconductor substrate, and which can avoid concentration of mechanical stress to prevent deterioration in electric property by crystal defect.

What is claimed are:

1. A semiconductor device including a semiconductor substrate which comprises:
   a first semiconducting region;
   a second semiconducting region formed on an upper surface of said first semiconducting region with higher impurity concentration than that of said first semiconducting region;
   a third semiconducting region of the conductivity type different from the conductivity types of said first and second semiconducting regions, said third semiconducting region being formed adjacent to said second semiconducting region and on the opposite side of said second semiconducting region from said first semiconducting region;
   a fourth semiconducting region formed on a bottom surface of said first semiconducting region with the higher impurity concentration than that of said first semiconducting region; and
   a PN junction region formed between said second and third semiconducting regions;
   wherein said third semiconducting region is formed in a whole upper surface of said semiconductor substrate;
   a periphery region is formed integrally with said third semiconducting region and annularly along whole side surfaces of said semiconductor substrate;
   said periphery region of the third semiconducting region is formed adjacent to the outer surfaces of said first, second and fourth semiconducting regions so as to encircle and cover said first, second and fourth semiconducting regions with said periphery region to prevent outward exposure of the outer surfaces of said first, second and fourth semiconducting regions from the side surfaces of said semiconductor substrate;
   the periphery region of said third semiconducting region is in contact to the outer surface of said fourth semiconducting region at a bottom surface of said semiconductor substrate;
   the bottom surface of said semiconductor substrate is covered with an insulating layer formed with an opening; and
   an electrode is in electrical contact to said fourth semiconducting region through said opening.

2. The semiconductor device of claim 1, wherein the outer surface of said first semiconducting region has an annular protrusion, the outer surfaces of said first and second semiconducting regions are inclined to upwardly taper off above said annular protrusion, and the outer surfaces of said first and fourth semiconducting regions are inclined to downwardly taper off below said annular protrusion whereby the outer surfaces of said second and fourth semiconducting regions are formed inside of the outer surface of said first semiconducting region away from the side surfaces of said semiconductor substrate.

3. The semiconductor device of claim 1, wherein impurity concentration of the periphery region of said third semiconducting region is smaller with increase in the depth from a main surface of said semiconductor substrate.

4. The semiconductor device of claim 1, wherein an inner PN junction is formed on a central side of said semiconductor substrate by contact between the periphery region of said third semiconducting region and the second and fourth semiconducting regions of relatively high impurity concentration; and an outer PN junction is formed on a periphery side of said semiconductor substrate by contact between the periphery region of said third semiconducting region and said first semiconducting region of relatively low impurity concentration.

* * * * *